United States Patent
Bullough (10) Patent No.: US 9,679,578 B1
(45) Date of Patent: Jun. 13, 2017

(54) SIGNAL CLIPPING COMPENSATION

(71) Applicant: Sorenson IP Holdings, LLC, Salt Lake City, UT (US)

(72) Inventor: Jeffrey C. Bullough, South Jordan, UT (US)

(73) Assignee: SORENSON IP HOLDINGS, LLC, Salt Lake City, UT (US)

( * ) Notice: Subject to any disclaimer, the term of this patent is extended or adjusted under 35 U.S.C. 154(b) by 0 days.

(21) Appl. No.: 15/253,142

(22) Filed: Aug. 31, 2016

(51) Int. Cl.
  *G10L 21/02* (2013.01)
  *G10L 21/0332* (2013.01)
  *H04L 27/26* (2006.01)

(52) U.S. Cl.
  CPC ...... *G10L 21/0332* (2013.01); *H04L 27/2623* (2013.01)

(58) Field of Classification Search
  CPC .. H04L 27/2623; H04L 27/2624; G10L 21/02
  See application file for complete search history.

(56) References Cited

U.S. PATENT DOCUMENTS

| | | |
|---|---|---|
| 4,777,469 A | 10/1988 | Engelke et al. |
| 4,959,847 A | 9/1990 | Engelke et al. |
| 5,081,673 A | 1/1992 | Engelke et al. |
| 5,325,417 A | 6/1994 | Engelke et al. |
| 5,327,479 A | 7/1994 | Engelke et al. |
| 5,331,587 A * | 7/1994 | Abel ............... G11B 20/1876 708/819 |
| 5,351,288 A | 9/1994 | Engelke et al. |
| 5,432,837 A | 7/1995 | Engelke et al. |
| D364,865 S | 12/1995 | Engelke et al. |
| 5,581,593 A | 12/1996 | Engelke et al. |
| 5,604,786 A | 2/1997 | Engelke et al. |

(Continued)

FOREIGN PATENT DOCUMENTS

WO   2004059956 A1   7/2004

OTHER PUBLICATIONS

Adler, Amir, et al. "A constrained matching pursuit approach to audio declipping." 2011 IEEE International Conference on Acoustics, Speech and Signal Processing (ICASSP). IEEE, 2011.*

(Continued)

*Primary Examiner* — Jialong He
(74) *Attorney, Agent, or Firm* — Maschoff Brennan (57) ABSTRACT

A method may include determining that values of a plurality of samples of a digital audio signal that are stored in an input buffer exceed a clipping threshold value. The method may further include identifying the plurality of samples that exceed the clipping threshold value as potentially clipped samples of the digital audio signal. In addition, the method may include generating, based on identification of the potentially clipped samples, attenuated samples by uniformly applying a fixed attenuation factor to the potentially clipped samples and to every sample of the digital audio signal included in the input buffer that follows the potentially clipped samples. Further, the method may include generating a plurality of modified attenuated samples by applying interpolation to the attenuated samples that correspond to the potentially clipped samples. The method may also include outputting the attenuated samples and the modified attenuated samples as a modified digital audio signal.

19 Claims, 5 Drawing Sheets

(56) References Cited

U.S. PATENT DOCUMENTS

| | | | |
|---|---|---|---|
| 5,638,403 A * | 6/1997 | Birchler | H04B 7/005 |
| | | | 332/159 |
| 5,687,222 A | 11/1997 | McLaughlin et al. | |
| 5,724,405 A | 3/1998 | Engelke et al. | |
| 5,809,425 A | 9/1998 | Colwell et al. | |
| 5,821,889 A * | 10/1998 | Miller | H03M 1/185 |
| | | | 341/139 |
| 5,909,482 A | 6/1999 | Engelke | |
| 5,974,116 A | 10/1999 | Engelke et al. | |
| 5,978,654 A | 11/1999 | Colwell et al. | |
| 6,075,842 A | 6/2000 | Engelke et al. | |
| 6,175,270 B1 * | 1/2001 | Vannucci | H03F 1/3241 |
| | | | 330/149 |
| 6,493,426 B2 | 12/2002 | Engelke et al. | |
| 6,504,910 B1 | 1/2003 | Engelke et al. | |
| 6,510,206 B2 | 1/2003 | Engelke et al. | |
| 6,594,346 B2 | 7/2003 | Engelke | |
| 6,603,835 B2 | 8/2003 | Engelke et al. | |
| 6,754,285 B1 * | 6/2004 | Kiykioglu | H04L 25/0286 |
| | | | 375/297 |
| 6,882,707 B2 | 4/2005 | Engelke et al. | |
| 6,885,731 B2 | 4/2005 | Engelke et al. | |
| 6,963,733 B2 * | 11/2005 | Eriksson | H03G 1/0023 |
| | | | 455/132 |
| 7,660,398 B2 | 2/2010 | Engelke et al. | |
| 7,881,441 B2 | 2/2011 | Engelke et al. | |
| 8,428,277 B1 * | 4/2013 | Skoglund | H03G 7/002 |
| | | | 361/119 |
| 8,862,257 B2 * | 10/2014 | Zhang | G10L 21/02 |
| | | | 700/94 |
| 9,324,322 B1 | 4/2016 | Torok et al. | |
| 9,325,286 B1 * | 4/2016 | Yang | H03G 3/20 |
| 9,350,857 B1 | 5/2016 | Engelke et al. | |
| 2005/0154584 A1 | 7/2005 | Jelinek et al. | |
| 2008/0056511 A1 | 3/2008 | Zhang et al. | |
| 2009/0034407 A1 * | 2/2009 | Lindh | H04L 27/2647 |
| | | | 370/210 |
| 2009/0034408 A1 * | 2/2009 | Kim | H04B 1/59 |
| | | | 370/210 |
| 2009/0083031 A1 | 3/2009 | Atlas et al. | |
| 2009/0262841 A1 * | 10/2009 | Chalil | H03G 11/008 |
| | | | 375/242 |
| 2009/0278583 A1 * | 11/2009 | Zheng | H04B 10/697 |
| | | | 327/306 |
| 2010/0161086 A1 | 6/2010 | Andersen | |
| 2012/0095580 A1 * | 4/2012 | Zhang | G10L 21/02 |
| | | | 700/94 |
| 2012/0136659 A1 * | 5/2012 | Kang | G10L 15/20 |
| | | | 704/231 |
| 2012/0226372 A1 | 9/2012 | Nakamura | |
| 2013/0282369 A1 | 10/2013 | Visser et al. | |
| 2014/0142958 A1 | 5/2014 | Sharma et al. | |
| 2014/0297293 A1 * | 10/2014 | Heuberger | G10L 25/69 |
| | | | 704/500 |
| 2016/0140979 A1 | 5/2016 | Disch et al. | |

OTHER PUBLICATIONS

Abel, Jonathan S., and Julius O. Smith. "Restoring a clipped signal." Acoustics, Speech, and Signal Processing, 1991. ICASSP-91., 1991 International Conference on. IEEE, 1991.*

* cited by examiner

SIGNAL CLIPPING COMPENSATION

FIELD

The embodiments discussed in the present disclosure are related to signal clipping compensation.

BACKGROUND

Signal processing systems typically have predetermined amplitude ranges in which they may effectively operate. Input signals with amplitudes that are outside of a predetermined amplitude range of a signal processing system may not be processed properly. In some instances, the improper processing may result in "signal clipping" in which the amplitudes of the input signals that are outside of the predetermined range may be clipped or cut off and the corresponding data may be lost.

For example, an analog to digital converter (ADC) of a digital signal processing system may have a particular amplitude range. The ADC may generate values for amplitudes of received analog signals that are outside of the particular amplitude range by forcing the corresponding values of the received analog signals into the particular amplitude range. The forcing of the values into the particular amplitude range may cause signal clipping in that the actual amplitudes of the received analog signals that are outside of the particular amplitude range may be cut off and not adequately represented in the generated digital signal.

The subject matter claimed in the present disclosure is not limited to embodiments that solve any disadvantages or that operate only in environments such as those described above. Rather, this background is only provided to illustrate one example technology area where some embodiments described herein may be practiced.

SUMMARY

A computer-implemented method to compensate for signal clipping may include determining that values of a plurality of samples of a digital audio signal that are stored in an input buffer exceed a clipping threshold value. The clipping threshold value may be related to clipping of the digital audio signal and is based on an amplitude limit of a system configured to perform operations with respect to the digital audio signal. The method may further include identifying the plurality of samples that exceed the clipping threshold value as potentially clipped samples of the digital audio signal. In addition, the method may include generating, based on identification of the potentially clipped samples, attenuated samples by uniformly applying a fixed attenuation factor to the potentially clipped samples and to every sample of the digital audio signal that is included in the input buffer and that follows the potentially clipped samples. Uniformly applying the fixed attenuation factor may attenuate the value of every sample that is attenuated by a same multiplication factor that corresponds to the fixed attenuation factor. Further, the method may include generating a plurality of modified attenuated samples by applying interpolation to the attenuated samples that correspond to the potentially clipped samples. The method may also include outputting the attenuated samples and the modified attenuated samples as a modified digital audio signal.

BRIEF DESCRIPTION OF THE DRAWINGS

Example embodiments will be described and explained with additional specificity and detail through the use of the accompanying drawings in which.

DESCRIPTION OF EMBODIMENTS

A signal processing system may be configured to receive an input signal and to perform processing with respect to the input signal. In some instances, one or more portions of the input signal may have an amplitude that may be outside of an operating range of the signal processing system such that the input signal may not be accurately processed or represented in the signal processing system. For example, in some instances, the improper processing may result in "signal clipping" in which the amplitudes of the input signals that are outside of the predetermined range may be clipped or cut off and the corresponding data may be lost.

Some embodiments in this disclosure relate to one or more systems and methods configured to compensate for signal clipping. In particular, potential clipping may be determined based on a clipping threshold by comparing values of samples of a digital signal to the clipping threshold. In response to determining that clipping may be present based on the comparison, an attenuation factor may be applied to the digital signal. Additionally or alternatively, interpolation may be performed with respect to portions of the digital signal that include samples determined to be potentially clipped. The attenuation and interpolation may result in a modified digital signal that may at least partially compensate for data loss and distortion that may be caused by the clipping.

In the present disclosure, digital values that represent amplitudes of signals (e.g., of corresponding digital signals or of analog signals that have been converted into the corresponding digital signals) may be referred to in the present disclosure as "digital samples" or "samples." The samples may be combined to generate a digital signal or converted into an analog signal. In some embodiments, the digital signal may be divided into frames in which each frame may include a particular number of samples. Additionally or alternatively, each frame may correspond to a particular amount of time. For example, in some embodiments, the digital signal may include a digital audio signal and a frame of the digital audio signal may correspond to 20 milliseconds worth of audio. In these and other embodiments, a sample rate of the digital audio signal may be 8 kilohertz (kHz), which may result in 8000 samples being obtained per second such that the frames may each include 160 samples.

Further, in the present disclosure, samples with values that may not accurately represent an input signal due to clipping may be referred to as "clipped samples." Similarly, portions of the digital signal that may include clipped samples may be referred to as "clipped portions." Additionally, a clipped portion may include a portion that only includes clipped samples or may include a portion that may have one or more non-clipped samples in addition to one or more clipped samples.

Figure 1:
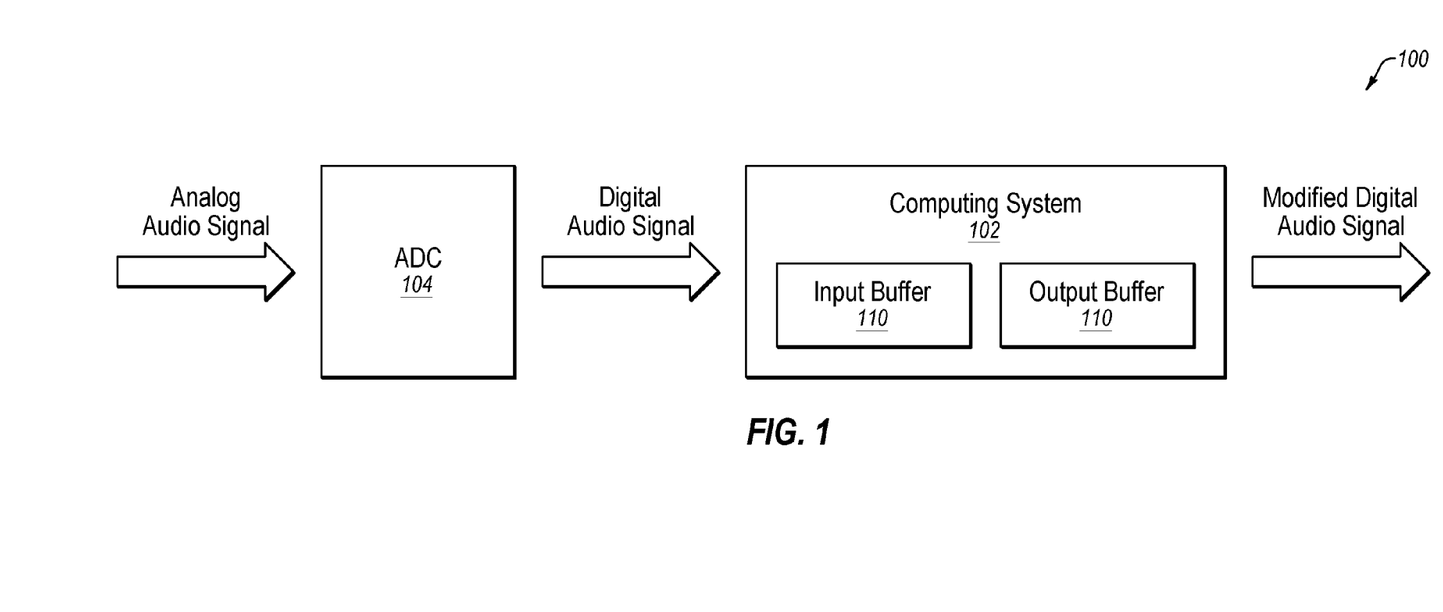
FIG. 1 illustrates an example system configured to compensate for signal clipping.

Turning to the figures, FIG. 1 illustrates an example system 100 configured to compensate for signal clipping. The system 100 may be arranged in accordance with at least one embodiment described in the present disclosure. The system 100 may part of a digital signal processing system in some embodiments and may include an analog to digital converter (ADC) 104 and a computing system 102.

The ADC 104 may include any suitable system, apparatus, or device configured to receive an analog signal and to convert the received analog signal into a digital signal. In the example of FIG. 1, the ADC 104 may be configured to receive an analog audio signal. In some embodiments, the analog audio signal may carry information related to a telephone call and may be received from any applicable source.

The ADC 104 may be configured to convert the analog audio signal into a digital audio signal. In particular, the ADC 104 may be configured to sample the amplitude of the analog audio signal at a particular rate and at discrete points in time. The ADC 104 may be configured to generate, as samples of the digital audio signal, values that each represent the amplitude of the analog audio signal at a particular point in time.

The ADC 104 may have a predetermined amplitude range in which it may effectively operate. For example, in some embodiments, the ADC 104 may have an upper amplitude limit and a lower amplitude limit. Additionally, in some instances, the amplitude of the received analog audio signal at one or more sampling times may exceed the upper amplitude limit (i.e., be higher than the upper amplitude limit) or may exceed the lower amplitude limit (i.e., be less than the lower amplitude limit). In such instances, the ADC 104 may represent the exceeding amplitude with the upper amplitude limit or with the lower amplitude limit such that signal clipping may occur.

For example, in some embodiments, the ADC 104 may be a 16 bit ADC in which the predetermined amplitude range of the ADC 104 may have an upper amplitude limit and a lower amplitude limit. The amplitude of the received analog signal at any particular sampling time may be represented by one of 65,536 values that may be between the lower amplitude limit and the upper amplitude limit. As such, in some instances, amplitudes that are not within the range of the 65,536 values may be represented by one of the 65,536 values (e.g., by the upper or lower limits), which may cause the corresponding digital audio signal to not accurately represent the amplitudes that are not within the range and may cause signal clipping.

In the present disclosure, amplitude limits and/or ranges of digital systems or components may be described with respect to the resolution of the digital system or components. In these and other embodiments, the resolution may refer to the number of different values or outputs for which the digital system or component may quantize a received signal. The resolution, also referred to herein as amplitude range, may be used in place of the actual amplitude values received by the digital system or component because the actual amplitude values may vary based on the step-size between the different values or outputs and voltage rails of the digital system or component. For example, a 16 bit component that may be configured to handle a particular range of voltages as amplitudes may be referred to as having an amplitude range or resolution of 65,536 instead of referring to an actual voltage range for the amplitude range. Similarly, the 16 bit component may be referred to as having an upper amplitude limit of 32,767 and a lower amplitude limit of −32,767 (or something else based on the number of different values) instead of being based on the actual upper and lower voltage values.

Moreover, sample values may be referred to based on which of the different values may be used as opposed to what that value represents. For example, in a 16 bit component with an upper amplitude voltage limit of 5 volts, the 5 volts may be represented by value number 32,767. In some embodiments, the sample value for the upper amplitude limit may be referred to as being 32,767 instead of being referred to as 5 volts. In addition, reference to amplitude limits of a "system" may include amplitude limits of one or more components included in the system.

The computing system 102 may be coupled to the ADC 104 in any suitable manner such that the computing system 102 is configured to receive the digital audio signal that may be output by the ADC 104. For example, in some embodiments, the digital audio signal may be processed before being provided to the computing system 102.

In some embodiments, the computing system 102 may be configured to temporarily store multiple samples of the digital audio signal in an input buffer 110. For example, in some embodiments, the computing system 102 may be configured to temporarily store one or more frames of the digital audio signal in the input buffer 110. Although the input buffer 110 is illustrated as a single input buffer, in some embodiments the input buffer 110 may include multiple input buffers in which each input buffer is configured to store a particular number of samples or frames.

The input buffer 110 may include any suitable system, apparatus, device, or routine configured to temporarily store the samples. For example, in some embodiments, the input buffer 110 may include Random Access Memory (RAM) that may temporarily store the particular number of samples. In these or other embodiments, the input buffer 110 may include one or more hardware or software modules or routines configured to control the temporary storage of the samples or frames.

The computing system 102 may be configured to perform one or more operations with respect to the samples stored in the input buffer 110. For example, as indicated above, in some instances, the digital audio signal that may be output by the ADC 104 may include one or more clipped samples with values that may not accurately represent the corresponding audio input signal due to signal clipping. The computing system 102 may be configured to perform operations with respect to the samples included in the input buffer 110 to help compensate for the clipping. In some embodiments, the computing system 102 may be configured to perform one or more operations described below with respect to a method 300 of FIG. 3 to help compensate for the clipping. In these or other embodiments, the computing system 102 may be configured to perform operations in addition to those described below with respect to FIG. 3.

Following the processing performed with respect to the samples stored in the input buffer 110, the computing system 102 may be configured to move the samples stored in the input buffer 110 to an output buffer 112. The samples may be temporarily stored in the output buffer 112 as well. The output buffer 112 may be analogous to the input buffer 110. In some instances, the samples that may be stored in the output buffer 112 may be modified samples as compared to when the samples were initially stored in the input buffer 110 in that one or more properties of the samples may be modified before being sent to the output buffer 112. For example, in some instances, one or more samples that are initially stored in the input buffer 110 may be clipped. As discussed in further detail below, the computing system 102 may perform clipping compensation operations on the samples included in the input buffer 110 based on one or more of the samples being clipped. The clipping compensation operations may modify the values of the samples such that the samples may be modified. The modified samples may then be moved from the input buffer 110 to the output buffer 112.

The computing system 102 may be configured to output the samples stored in the output buffer 112 as a digital audio signal. The output buffer 112 may be configured to collect the processed samples and then pass them on to another system. As mentioned above, in some instances, the samples stored in the output buffer 112 may be modified such that the digital audio signal that may be output by the computing system 102 may be output as a modified digital audio signal that includes modified samples. The modified digital audio signal may carry information related to a telephone call and may be communicated to any applicable source in some embodiments. In these or other embodiments, the modified digital audio signal may be communicated to a telephone captioning system such that the modified digital audio signal and its corresponding samples may be used with respect to the telephone captioning system.

The computing system 102 may include any suitable system, apparatus, or device configured to perform the operations described with respect to the computing system. For example, the computing system 102 may be analogous to a computing system 202 described below with respect to FIG. 2.

Modifications, additions, or omissions may be made to the system 100 without departing from the scope of the present disclosure. For example, in some embodiments, the system 100 may include one or more other components not explicitly illustrated or described. In particular, in some embodiments, the system 100 may include a digital to analog converter (DAC) that is configured to convert the modified digital audio signal into an analog audio signal. Additionally, in the above description, the clipping is described as being caused by the ADC 104. However, the signal clipping may be caused by any number of other components of the system 100. As such, the clipping compensation that may be performed by the computing system 102 may be performed with respect to signals that are clipped by components other than an ADC. Additionally, the examples given in the present disclosure are given with respect to audio signals, but the principles described may apply to other signals that may be affected by signal clipping.

Figure 2:
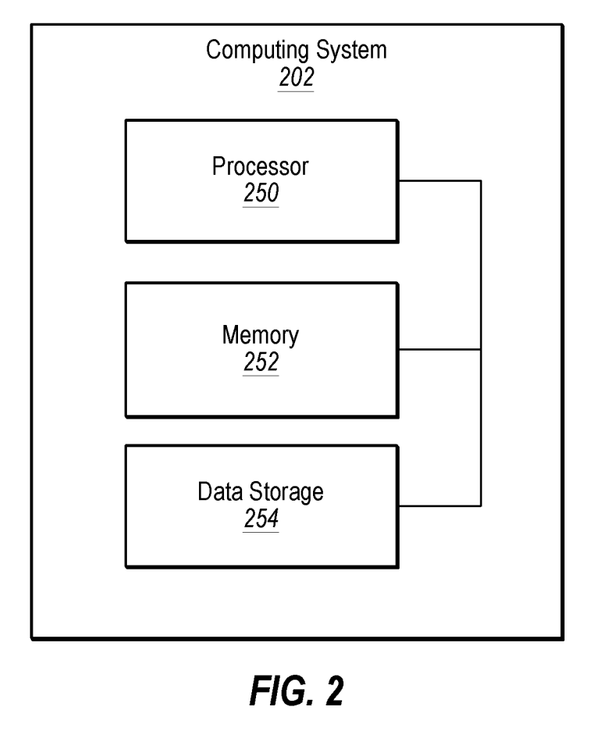
FIG. 2 illustrates an example computing system that may be used in signal clipping compensation.

FIG. 2 illustrates a block diagram of an example computing system 202. The computing system 202 may be configured according to at least one embodiment of the present disclosure. The computing system 202 may be an example of the computing system 102 described above. The computing system 202 may include a processor 250, a memory 252, and a data storage 254. The processor 250, the memory 252, and the data storage 254 may be communicatively coupled.

In general, the processor 250 may include any suitable special-purpose or general-purpose computer, computing entity, or processing device including various computer hardware or software modules and may be configured to execute instructions stored on any applicable computer-readable storage media. For example, the processor 250 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data. Although illustrated as a single processor in FIG. 2, the processor 250 may include any number of processors configured to, individually or collectively, perform or direct performance of any number of operations described in the present disclosure. Additionally, one or more of the processors may be present on one or more different electronic devices, such as different servers.

In some embodiments, the processor 250 may be configured to interpret and/or execute program instructions and/or process data stored in the memory 252, the data storage 254, or the memory 252 and the data storage 254. In some embodiments, the processor 250 may fetch program instructions from the data storage 254 and load the program instructions in the memory 252. After the program instructions are loaded into memory 252, the processor 250 may execute the program instructions.

For example, in some embodiments, one or more signal processing modules may be included in the data storage 254 as program instructions. The processor 250 may fetch the program instructions of the signal processing modules from the data storage 254 and may load the program instructions in the memory 252. After the program instructions of the signal processing modules are loaded into memory 252, the processor 250 may execute the program instructions such that the computing system may implement the operations associated with the signal processing modules as directed by the instructions. In some embodiments, the signal processing modules may be configured to direct operations associated with compensating for signal clipping. In these or other embodiments, the signal processing modules may include one or more modules or routines configured as part of an input buffer or an output buffer such as described above with respect to the input buffer 110 and the output buffer 112.

The memory 252 and the data storage 254 may include computer-readable storage media for carrying or having computer-executable instructions or data structures stored thereon. Such computer-readable storage media may include any available media that may be accessed by a general-purpose or special-purpose computer, such as the processor 250. By way of example, and not limitation, such computer-readable storage media may include tangible or non-transitory computer-readable storage media including RAM, ROM, EEPROM, CD-ROM or other optical disk storage, magnetic disk storage or other magnetic storage devices, flash memory devices (e.g., solid state memory devices), or any other storage medium which may be used to carry or store particular program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause the processor 250 to perform a certain operation or group of operations. In some embodiments, the memory 252 may include memory locations that may be used as an input buffer or an output buffer such as described above with respect to the input buffer 110 and the output buffer 112.

Modifications, additions, or omissions may be made to the computing system 202 without departing from the scope of the present disclosure. For example, in some embodiments, the computing system 202 may include any number of other components that may not be explicitly illustrated or described.

Figure 3:
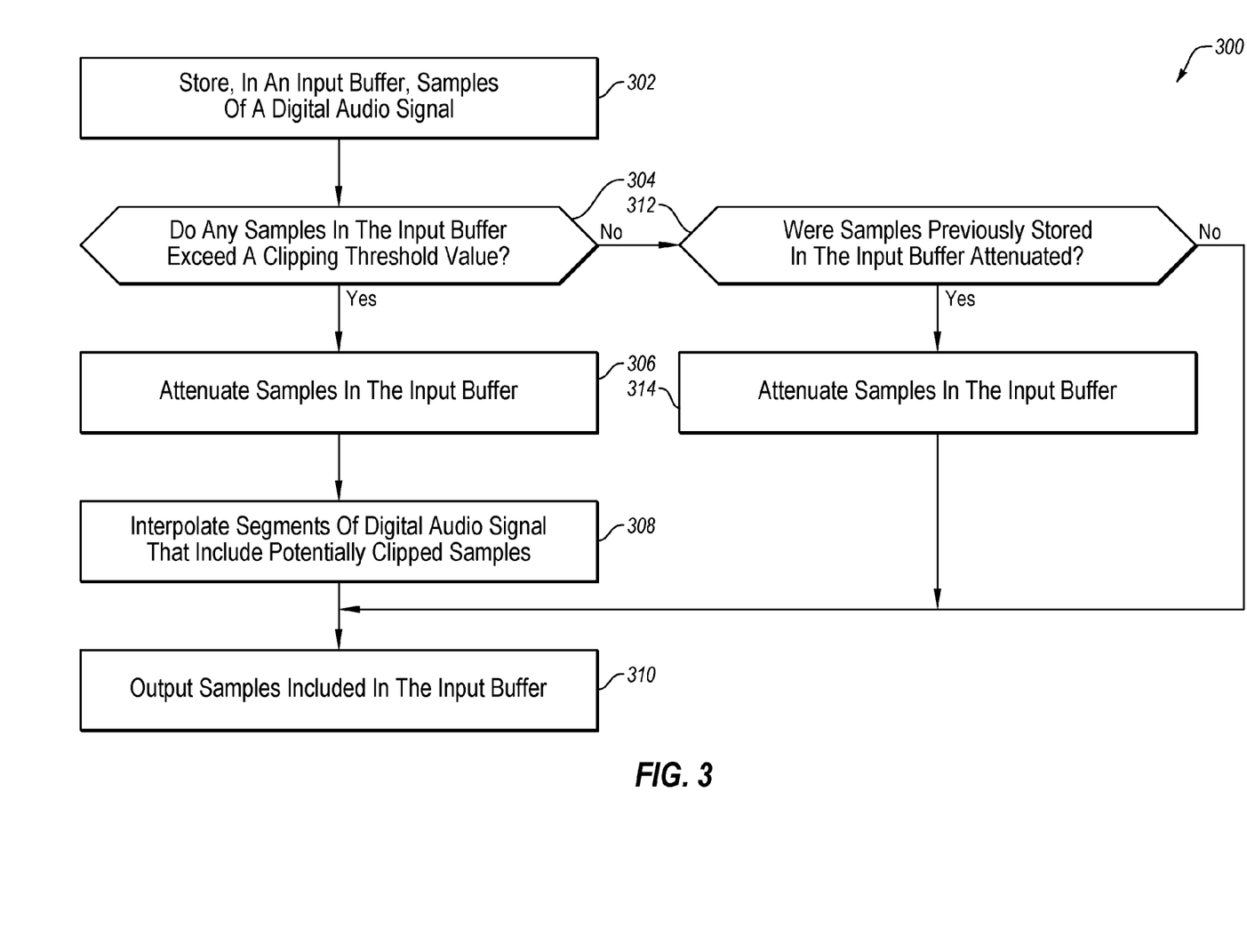
FIG. 3 is a flowchart of an example method to compensate for signal clipping.

FIG. 3 is a flowchart of an example computer-implemented method 300 to compensate for signal clipping. The method 300 may be arranged in accordance with at least one embodiment described in the present disclosure. The method 300 may be implemented, in some embodiments, by a computing system such as the computing systems 102 and 202 described above with respect to FIGS. 1 and 2. In some embodiments, the method 300 may result from operations performed by a system based on instructions stored in one or more computer-readable media. Although illustrated as discrete blocks, various blocks may be divided into additional blocks, combined into fewer blocks, or eliminated, depending on the desired implementation.

The method 300 may begin at block 302 where samples of a digital audio signal may be stored in an input buffer. In some embodiments, the digital audio signal may include multiple frames and one or more frames may be stored in the input buffer. In some embodiments, the samples may be temporarily stored in the input buffer for processing and may be removed from the input buffer following the processing.

At block 304, it may be determined whether any of the samples currently stored in the input buffer exceed one or more clipping threshold values. In some embodiments, the clipping threshold values may be based on one or more amplitude limits of a system configured to perform operations with respect to the digital audio signal.

For example, the clipping threshold values may be based on an amplitude range of an ADC or another component of the system. In particular, the ADC may include an amplitude range with an upper amplitude limit and a lower amplitude limit. An upper clipping threshold value may be based on the upper amplitude limit and a lower clipping threshold value may be based on the lower amplitude limit. In some embodiments, the upper clipping threshold value may be in the amplitude range and within 15% of the upper amplitude limit. Additionally or alternatively, the lower clipping threshold value may be in the amplitude range and within 15% of the lower amplitude limit. For example, the ADC may be a 16 bit ADC with an upper amplitude limit of 32,767 and with a lower amplitude limit of −32,767. The upper clipping threshold value may be 32,000 and the lower clipping threshold value may be −32,000.

In the present disclosure, reference to samples exceeding a particular clipping threshold value may refer to samples with values that are between the particular clipping threshold value and a corresponding amplitude limit. For example, with respect to an upper amplitude limit of 32,767, a sample with a sample value of 32,001 would be considered exceeding a corresponding upper clipping threshold value of 32,000. Further, as another example, with respect to a lower amplitude limit of −32,767, a sample with a sample value of −32,001 would be considered exceeding a corresponding lower clipping threshold value of 32,000.

In some embodiments, samples included in the input buffer that exceed a clipping threshold value may be identified as "potentially clipped samples." Further, portions of the digital audio signal that include potentially clipped samples may be referred to as "potentially clipped portions." Additionally, in some embodiments, in response to identifying one or more potentially clipped samples, the samples in the input buffer may be flagged to indicate that one or more of the samples stored therein are potentially clipped samples. In these or other embodiments, the input buffer may include one or more frames and the samples stored in the input buffer may be flagged by flagging the frames.

In response to determining that one or more samples stored in the input buffer exceed a clipping threshold value, the method 300 may proceed to block 306. For example, in some embodiments, the method 300 may proceed from block 304 to block 306 in response to identification of the potentially clipped samples. In these or other embodiments, the method 300 may proceed from block 304 to block 306 based on the samples in the input buffer being flagged.

Figure 4:
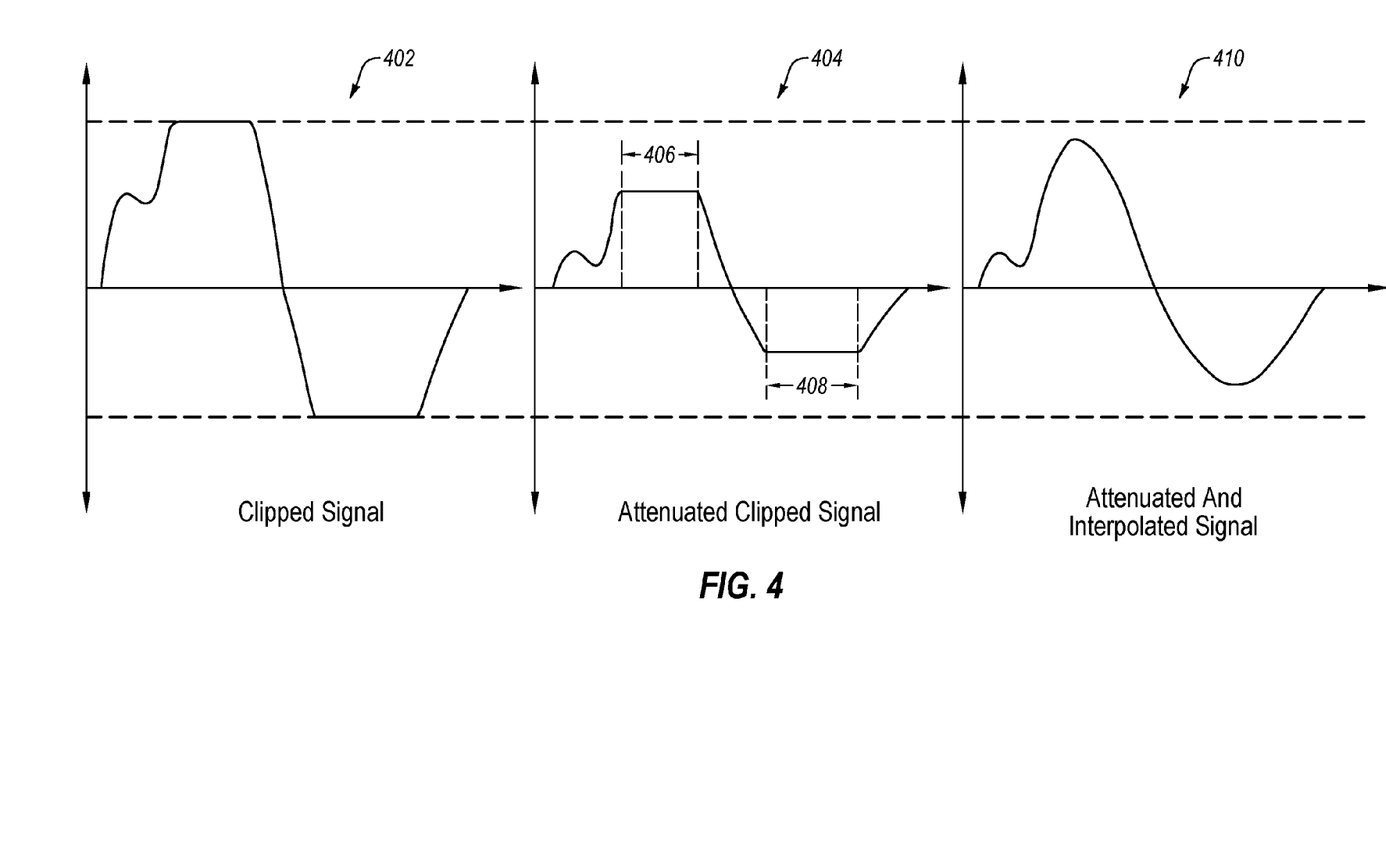
FIG. 4 illustrates example signals.

At block 306, the potentially clipped samples and every sample included in the input buffer that follows the potentially clipped samples may be attenuated in response to one or more of the samples stored in the input buffer being potentially clipped samples. In some embodiments, every sample included in the input buffer (including those that precede the potentially clipped samples) may be attenuated in response to one or more of the samples stored in the input buffer being potentially clipped samples. In some embodiments, the samples may be attenuated based on being flagged. In these or other embodiments, an attenuation factor may be applied to the value of every sample that is attenuated to attenuate the samples. In some embodiments, the attenuation factor may indicate a multiplication factor that may be applied to every sample that is attenuated such that each sample value is attenuated. For example, the attenuation factor may be 12 decibels (dB) such that the value of 0.063 (1/(12 dB)) may be multiplied to the value of every sample that is attenuated. By way of illustrative example, FIG. 4 illustrates a clipped signal 402 that corresponds to samples stored in the input buffer prior to application of the attenuation factor. Additionally, FIG. 4 illustrates an attenuated clipped signal 404 that corresponds to the samples stored in the input buffer after application of the attenuation factor.

As indicated above, the attenuation factor may be uniformly applied to every sample that is attenuated in some embodiments. Additionally or alternatively, in some embodiments, the attenuation factor may be a fixed value that may be based on a particular implementation of the system configured to process signals. For example, the attenuation factor may be based on a resolution of the system, a headroom of the system, a dynamic range of the system, etc. Additionally or alternatively, in some embodiments, the attenuation factor may be based on the input signal. For example, the attenuation factor may be based on potential signal loss of potential values of the input signal. In some embodiments, the attenuation factor may be based on interpolation values (described in detail below) that may be determined for potentially clipped samples. For example, in some embodiments, the interpolation values may be determined and the attenuation factor may be determined such that the interpolation values with the attenuation factor applied may be within the amplitude limit of the system. By way of example, in some embodiments, the attenuation factor may be between 1 dB and 50 dB.

At block 308, interpolation may be applied to one or more of the attenuated samples. For example, in some embodiments, interpolation may be applied to the attenuated samples that correspond to potentially clipped samples. In the present disclosure, reference to attenuated samples that correspond to potentially clipped samples may refer to potentially clipped samples that have been attenuated, which may be referred to as "attenuated potentially clipped samples." Further, potentially clipped portions that have been attenuated may be referred to as "attenuated potentially clipped portions."

The interpolation may be used to estimate values for the attenuated potentially clipped samples within the attenuated potentially clipped portions. The estimated values may reduce sharp corners in the corresponding digital audio signal that may be caused by the clipping. For example, a first slope of the digital audio signal prior to a particular attenuated potentially clipped portion may be determined. Further, a second slope of the digital signal after the particular attenuated potentially clipped portion may be determined. In some embodiments, the first slope may be determined based on the values of two or more samples that precede the particular attenuated potentially clipped portion and the second slope may be determined based on the values of two or more samples that follow the particular attenuated potentially clipped portion. The number of samples used to determine the slope may vary based on a target degree of accuracy for the slopes or a target amount of processing that may be used.

The first and second slopes may be used to determine a curve for the particular attenuated potentially clipped portion. Values may be applied to the attenuated potentially clipped samples of the particular attenuated potentially clipped portion as interpolation values based on the determined curve and based on the values of attenuated samples that precede and follow the particular attenuated potentially clipped portion. In some embodiments, interpolation values may also be applied to samples that may closely or immediately precede or follow the attenuated and potentially clipped portion. Attenuated potentially clipped samples with attenuation values applied to them may be referred to as "modified attenuated samples" in the present disclosure.

By way of illustrative example, the attenuated clipped signal 404 of FIG. 4 may include a first attenuated clipped portion 406 and a second attenuated clipped portion 408. Based on the slopes of the attenuated clipped signal 404 before and after the first attenuated clipped portion 406 and the second attenuated clipped portion 408, first and second curves may be determined. Further, first interpolation values for first attenuated clipped samples of the first attenuated clipped portion 406 may be determined based on the first curve and based on the values of samples that precede and follow the first attenuated clipped portion 406. Similarly, second interpolation values for second attenuated clipped samples of the second attenuated clipped portion 408 may be determined based on the second curve and based on the values of samples that precede and follow the second attenuated clipped portion 408. Applying the first interpolation values to the first attenuated clipped samples of the first attenuated clipped portion 406 may create first modified attenuated samples. Additionally, applying the second interpolation values to the second attenuated clipped samples of the second attenuated clipped portion 408 may create second modified attenuated samples. The creation of the first and second modified attenuated samples may result in changing the attenuated clipped signal 404 to a modified signal 410 that may be attenuated and interpolated.

The interpolation may be performed using any suitable technique. In some embodiments, the interpolation technique used may be based on the waveform type of the input signal. By way of example, a polynomial interpolation technique, a sine interpolation technique, or a spline interpolation technique may be used in some embodiments. Further, in some embodiments, the interpolation may be performed with respect to one or more attenuated samples that are not attenuated potentially clipped samples but that immediately precede or follow attenuated clipped portions.

At block 310, the attenuated samples and the modified attenuated samples that are stored in the input buffer may be output as a modified digital audio signal. In some embodiments, the modified digital audio signal may be output to an output buffer. In these or other embodiments, the modified digital audio signal may be output from the output buffer for reception or use by one or more systems. Additionally or alternatively, in some embodiments, the modified digital audio signal may be output for use by a telephone captioning system. In some embodiments, processing unrelated to clipping compensation may be performed on one or more of the samples stored in the input buffer before being output from the input buffer.

Returning to block 304, in response to determining that none of the samples included in the input buffer exceed a clipping threshold value, the method 300 may proceed to block 312 in some embodiments. At block 312 it may be determined whether samples that were previously stored in the input buffer were attenuated. For example, in some embodiments, the input buffer may be configured to store a frame and it may be determined whether the frame that was stored in the input buffer immediately prior to the frame currently stored in the input buffer underwent any attenuation. In some embodiments, the attenuation may be that performed at block 306 or at block 314 as described in further detail below. In response to determining that samples previously stored in the input buffer were attenuated, the method 300 may proceed to block 314.

At block 314, every sample in the input buffer may be attenuated. In some embodiments, the attenuation may be analogous to that described above with respect to block 306. Additionally or alternatively, the attenuation performed at block 314 may be based on gradually reducing the attenuation of samples that get stored in the input buffer. In these or other embodiments, the attenuation performed at block 314 may be based on an attenuation factor of the samples that were previously stored in the input buffer ("previous samples") such that it may be less than the previous attenuation.

For example, a first attenuation factor applied to the previous samples may result in a first amount of attenuation. At block 314 a second attenuation factor may be applied to the samples that are currently stored in the input buffer ("current samples"). The second attenuation factor may be generated as being less than the first attenuation factor such that a second amount of attenuation that is applied to the current samples may be less than the first amount of attenuation applied to the previous samples.

The amount that the second attenuation factor is reduced as compared to the first attenuation factor may be based on an optimization in some embodiments. Additionally or alternatively, the optimization may be based on system characteristics. For example, abrupt changes in signal amplitude may create noise and artifacts and to varying degrees based on different system characteristics. As such, the amount that the second attenuation factor is reduced as compared to the first attenuation factor may be based on how well the particular system handles those changes. For example, a first system may handle changes better than a second system such that the second attenuation factor may be reduced as compared to the first attenuation factor by a first degree (e.g., 25%) for the first system that is greater than the reduction by a second degree (e.g., 10%) for the second system. The optimization may be based on how well the particular system handles noise balanced with reducing the total amount of attenuation as much as possible. By way of example, the reduction of the second attenuation factor as compared to the first attenuation factor may be in the range of 5%-50% in some embodiments.

Following block 314, the method 300 may proceed to block 310. Additionally, returning to block 312, in response to determining that samples previously stored in the input buffer were not attenuated, the method 300 may proceed to block 310 as well. As mentioned above, in some embodiments, processing unrelated to clipping compensation may be performed on one or more of the samples stored in the input buffer before being output from the input buffer at block 310.

For this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, with respect to blocks 312 and 314, in some embodiments, the attenuation of the previous samples may be such that an attenuation of the current samples may not be performed. In some of these embodiments, although the previous samples may have been attenuated, the current samples may be not be attenuated at block 314. Further, in some embodiments, the operations described with respect to blocks 312 and 314 may be omitted. Additionally, in the above description the interpolation operations are described as being performed after the attenuation. However, in some embodiments, one or more of the interpolation operations may be performed before attenuation is applied in some instances.

Figure 5:
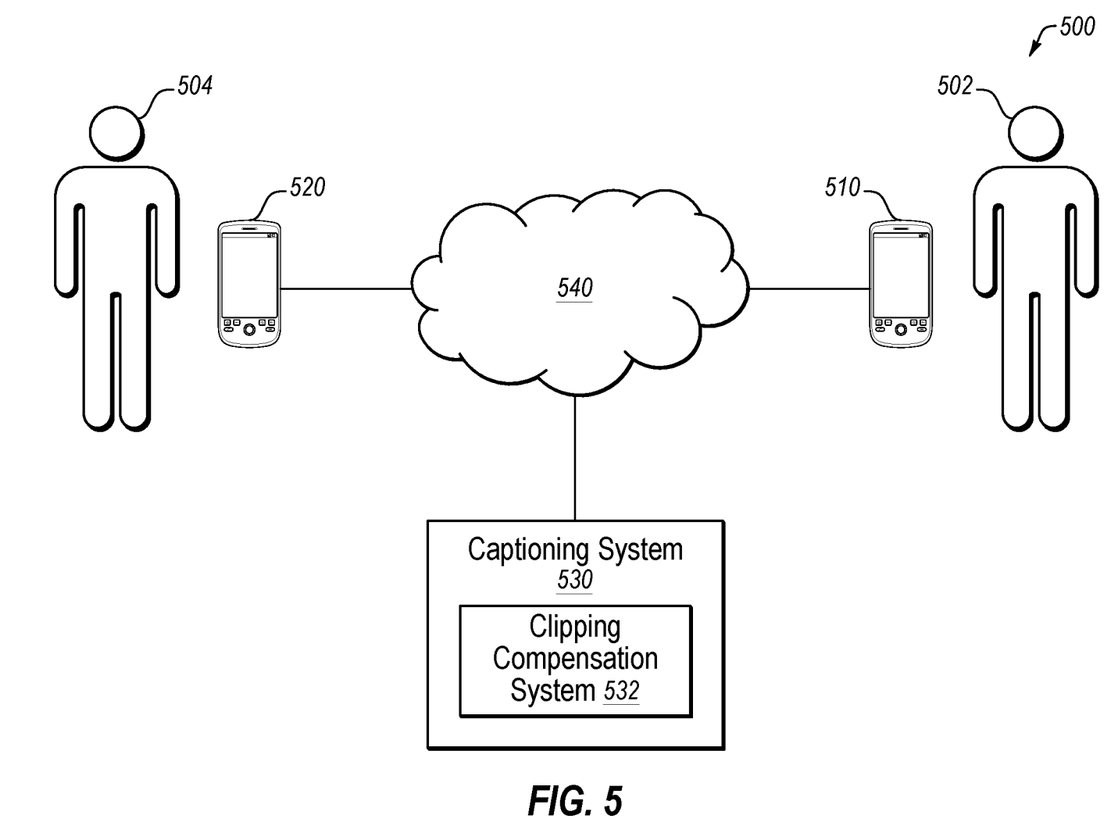
FIG. 5 illustrates an example communication system that may include a telephone captioning system.

FIG. 5 illustrates an example communication system 500 that may include a telephone captioning system 530 ("captioning system 530"). The communication system 500 may be arranged in accordance with at least one embodiment described in the present disclosure. The communication system 500 may include a first device 510, a second device 520, and a captioning system 530 that includes a clipping compensation system 532. The first device 510 and the captioning system 530 may be communicatively coupled by a network 540. Alternately or additionally, the first device 510 and the second device 520 may be communicatively coupled by the network 540. In these or other embodiments, the second device 520 and the captioning system 530 may be communicatively coupled by the network 540.

The first device 510 and the second device 520 may be any electronic or digital device. For example, the first device 510 and the second device 520 may include a desktop computer, a laptop computer, a smartphone, a mobile phone, a tablet computer, a phone console, or any other processing device. In some embodiments, a communication session may be established between the first device 510 and the second device 520. Alternately or additionally, the first device 510 and the second device 520 may be configured to communicate with other systems such as the captioning system 530.

The network 540 may include any network or configuration of networks configured to send and receive communications between devices. In some embodiments, the network 540 may include a conventional type network, a wired or wireless network, and may have numerous different configurations. Furthermore, the network 540 may include a local area network (LAN), a wide area network (WAN) (e.g., the Internet), or other interconnected data paths across which multiple devices and/or entities may communicate. In some embodiments, the network 540 may include a peer-to-peer network. The network 540 may also be coupled to or may include portions of a telecommunications network for sending data in a variety of different communication protocols. In some embodiments, the network 540 may include Bluetooth® communication networks or cellular communication networks for sending and receiving communications and/or data including via short message service (SMS), multimedia messaging service (MMS), hypertext transfer protocol (HTTP), direct data connection, wireless application protocol (WAP), e-mail, etc. The network 540 may also include a mobile data network that may include third-generation (3G), fourth-generation (4G), long-term evolution (LTE), long-term evolution advanced (LTE-A), Voice-over-LTE ("VoLTE") or any other mobile data network or combination of mobile data networks. Further, the network 540 may include one or more IEEE 802.11 wireless networks.

In some embodiments, the communication system 500 illustrated may be configured to facilitate an assisted call between a hearing-impaired user 502 and a second user 504. As used in the present disclosure, a "hearing-impaired user" may refer to a person with diminished hearing capabilities. Hearing-impaired users often have some level of hearing ability that has usually diminished over a period of time such that the hearing-impaired user can communicate by speaking, but that the hearing-impaired user often struggles in hearing and/or understanding others.

The captioning system 530 may be an assistive service, which is intended to permit a hearing-impaired person to utilize a communication network and assist their understanding of a conversation by providing text captions to supplement voice conversation occurring during communication sessions with other devices, such as the second device 520.

During a captioning communication session, the captioning system 530 and the first device 510 maybe be communicatively coupled using networking protocols. In some embodiments, during the communication session between the first device 510 and the second device 520, the first device 510 may provide the audio signal from the second device 520 to the captioning system 530.

In some embodiments, the clipping compensation system 532 of the captioning system 530 may include the computing system 102 or 202 and may be configured to perform operations described above with respect to the computing systems 102 and 202 with respect to clipping compensation. In these or other embodiments, the clipping compensation system 532 may be configured to compensate for clipping that may be associated with the audio signal provided by the first device 510. In these or other embodiments, the clipping compensation system 532 may be configured to generate a modified audio signal that at least partially compensates for clipping.

At the captioning system 530, a call assistant may listen to the audio signal of the second user 504 and "revoice" the words of the second user 504 to a speech recognition computer program tuned to the voice of the call assistant. In some embodiments, the audio signal listened to by the call assistant may include or be based on the modified audio signal that may be generated by the clipping compensation system 532. In these and other embodiments, the call assistant may be an operator who serves as a human intermediary between the hearing-impaired user 502 and the second user 504. In some embodiments, text captions may be generated by the speech recognition computer as a transcription of the audio signal of the second user 504. The text captions may be provided to the first device 510 being used by the hearing-impaired user 502 over the network 540. The first device 510 may display the text captions while the hearing-impaired user 502 carries on a normal conversation with the second user 504. The text captions may allow the hearing-impaired user 502 to supplement the voice signal received from the second device 520 and confirm his or her understanding of the words spoken by the second user 504.

Modifications, additions, or omissions may be made to the communication system 500 without departing from the scope of the present disclosure. For example, in some embodiments, the second user 504 may be hearing impaired. In these and other embodiments, the captioning system 530 may provide text captions to the second device 520 based on audio data transmitted by the first device 510. Alternately or additionally, the captioning system 530 may include additional functionality. For example, the captioning system 530 may edit the text captions or make other alterations to the text captions after presentation of the text captions on the first device 510. Further, in some embodiments, the captioning system 530 or the clipping compensation system 532 may be included in the first device 510 or the second device 520.

As indicated above, the embodiments described in the present disclosure may include the use of a special purpose or general purpose computer (e.g., the processor 250 of FIG. 2) including various computer hardware or software modules, as discussed in greater detail below. Further, as indicated above, embodiments described in the present disclosure may be implemented using computer-readable media (e.g., the memory 252 or data storage 254 of FIG. 2) for carrying or having computer-executable instructions or data structures stored thereon.

In some embodiments, the different components, modules, engines, and services described herein may be implemented as objects or processes that execute on a computing system (e.g., as separate threads). While some of the systems and methods described in the present disclosure are generally described as being implemented in software (stored on and/or executed by general purpose hardware), specific hardware implementations or a combination of software and specific hardware implementations are also possible and contemplated.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used in the present disclosure to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A computer-implemented method to compensate for signal clipping, the method comprising:

determining that values of a plurality of samples of a digital audio signal that are stored in an input buffer exceed a clipping threshold value, wherein the clipping threshold value is related to clipping of the digital audio signal and is based on an amplitude limit of a system configured to perform operations with respect to the digital audio signal;

identifying the plurality of samples that exceed the clipping threshold value as potentially clipped samples of the digital audio signal;

generating, based on identification of the potentially clipped samples, attenuated samples by uniformly applying a fixed attenuation factor to the potentially clipped samples and to every sample of the digital audio signal that is included in the input buffer and that follows the potentially clipped samples, wherein the fixed attenuation factor is based on one or more of: a resolution of the system, a headroom of the system, a dynamic range of the system, and potential signal loss and wherein uniformly applying the fixed attenuation factor attenuates the value of every sample that is attenuated by a same multiplication factor that corresponds to the fixed attenuation factor;

generating a plurality of modified attenuated samples by applying interpolation to the attenuated samples that correspond to the potentially clipped samples; and outputting the attenuated samples and the modified attenuated samples as a modified digital audio signal.

2. The method of claim 1, wherein generating the attenuated samples based on identification of the potentially clipped samples comprises:

flagging the samples included in the input buffer for attenuation based on the samples included in the input buffer including the potentially clipped samples; and generating the attenuated samples with respect to the flagged samples.

3. The method of claim 2, wherein:

the samples included in the input buffer are included in one or more frames of the digital audio signal; and flagging the samples includes flagging the one or more frames.

4. The method of claim 1, further comprising using the modified attenuated samples with respect to a telephone captioning system.

5. The method of claim 1, wherein applying the interpolation includes performing one or more of the following interpolation techniques: a polynomial interpolation technique, and a spline interpolation technique.

6. The method of claim 1, further comprising attenuating an other set of samples that are included in the input buffer after the attenuated samples and the modified attenuated samples are output from the input buffer, wherein the other set of samples does not include any identified potentially clipped samples and are attenuated based on the attenuated samples and the modified attenuated samples being previously stored in the input buffer and being attenuated.

7. The method of claim 6, wherein the fixed attenuation factor is a first attenuation factor and wherein attenuating the other set of samples includes applying a second attenuation factor that is smaller than the first attenuation factor to the other set of samples such that the other set of samples are attenuated less than the attenuated samples and the modified attenuated samples.

8. The method of claim 1, further comprising uniformly applying the fixed attenuation factor to every sample of the digital audio signal that is included in the input buffer.

9. At least one non-transitory computer readable media configured to store one or more instructions that when executed by at least one computing system cause the at least one computing system to perform the method of claim 1.

10. A method comprising:

determining that values of a plurality of samples of a first frame of a digital audio signal that is stored in an input buffer exceed a clipping threshold value, wherein the clipping threshold value is related to clipping of the digital audio signal and is based on an amplitude limit of a system configured to perform operations with respect to the digital audio signal;

identifying the plurality of samples that exceed the clipping threshold value as potentially clipped samples of the digital audio signal;

generating, based on identification of the potentially clipped samples, attenuated samples by uniformly applying a first fixed attenuation factor to the potentially clipped samples and to every sample of the first frame that is included in the input buffer and that follows the potentially clipped samples, wherein the fixed attenuation factor is based on one or more of: a resolution of the system, a headroom of the system, a dynamic range of the system, and potential signal loss and wherein uniformly applying the fixed attenuation factor attenuates the value of every sample that is attenuated by a same multiplication factor that corresponds to the fixed attenuation factor;

generating a plurality of modified attenuated samples by applying interpolation to the attenuated samples that correspond to the potentially clipped samples;

outputting the attenuated samples and the modified attenuated samples as a modified first frame; and attenuating, by a second fixed attenuation factor that is smaller than the first fixed attenuation factor, every sample of a second frame of the digital signal that is stored in the input buffer after the modified first frame is output from the input buffer, wherein the second frame does not include any identified potentially clipped samples and is attenuated based on the modified first frame being previously stored in the input buffer and having attenuated samples.

11. The method of claim 10, wherein generating the attenuated samples based on identification of the potentially clipped samples comprises:

flagging the samples included in the input buffer for attenuation based on the samples included in the input buffer including the potentially clipped samples; and generating the attenuated samples with respect to the flagged samples.

12. The method of claim 11, wherein flagging the samples includes flagging the first frame.

13. The method of claim 10, further comprising using the modified attenuated samples with respect to a telephone captioning system.

14. The method of claim 10, wherein applying the interpolation includes performing one or more of the following interpolation techniques: a polynomial interpolation technique, and a spline interpolation technique.

15. The method of claim 10, further comprising uniformly applying the fixed attenuation factor to every sample of the digital audio signal that is included in the input buffer.

16. At least one non-transitory computer readable media is configured to store one or more instructions that when executed by at least one computing system cause the at least one system to perform the method of claim 10.

17. A system comprising:

a processor; and at least one non-transitory computer readable media communicatively coupled to the processor and configured to store one or more instructions that when executed by the processor causes a computing system to perform operations, the operations comprising:

determining that values of a plurality of samples of a digital audio signal that are stored in an input buffer exceed a clipping threshold value;

identifying the plurality of samples that exceed the clipping threshold value as potentially clipped samples of the digital audio signal;

generating, based on identification of the potentially clipped samples, attenuated samples by uniformly applying a fixed attenuation factor to the potentially clipped samples and to every sample of the digital audio signal that is included in the input buffer and that follows the potentially clipped samples, wherein the fixed attenuation factor is based on one or more of: a resolution of the system, a headroom of the system, a dynamic range of the system, and potential signal loss and wherein uniformly applying the fixed attenuation factor attenuates the value of every sample that is attenuated by a same multiplication factor that corresponds to the fixed attenuation factor;

generating a plurality of modified attenuated samples by applying interpolation to the attenuated samples that correspond to the potentially clipped samples; and outputting the attenuated samples and the modified attenuated samples as a modified digital audio signal.

18. The system of claim 17, wherein the clipping threshold value is related to clipping of the digital audio signal and is based on an amplitude limit of a system configured to perform operations with respect to the digital audio signal.

19. The system of claim 17, wherein the operations further comprise uniformly applying the fixed attenuation factor to every sample that is included in the input buffer.

* * * * *